United States Patent
Liu et al.

(10) Patent No.: US 11,637,187 B2
(45) Date of Patent: Apr. 25, 2023

(54) DOUBLE CONTROL GATE SEMI-FLOATING GATE TRANSISTOR AND METHOD FOR PREPARING THE SAME

(71) Applicant: Shanghai Huali Integrated Circuit Corporation, Shanghai (CN)

(72) Inventors: Heng Liu, Shanghai (CN); Zhigang Yang, Shanghai (CN); Jianghua Leng, Shanghai (CN); Tianpeng Guan, Shanghai (CN)

(73) Assignee: Shanghai Huali Integrated Circuit Corporation, Shanghai (CN)

(*) Notice: Subject to any disclaimer, the term of this patent is extended or adjusted under 35 U.S.C. 154(b) by 0 days.

(21) Appl. No.: 17/400,657

(22) Filed: Aug. 12, 2021

(65) Prior Publication Data
US 2022/0238671 A1   Jul. 28, 2022
US 2022/0238671 A1   Jul. 28, 2022

(30) Foreign Application Priority Data

Jan. 28, 2021 (CN) .......................... 202110115619.7

(51) Int. Cl.
*H01L 29/788* (2006.01)
*H01L 29/423* (2006.01)
*H01L 29/66* (2006.01)

(52) U.S. Cl.
CPC .. *H01L 29/42324* (2013.01); *H01L 29/66825* (2013.01); *H01L 29/788* (2013.01)

(58) Field of Classification Search
None
See application file for complete search history.

(56) References Cited

U.S. PATENT DOCUMENTS

2009/0014776 A1* 1/2009 Strenz .................. H01L 27/115
                                                      257/E21.422
2020/0152646 A1* 5/2020 Fan ........................ H01L 29/517

FOREIGN PATENT DOCUMENTS

CN           111508961  A    *   8/2020

OTHER PUBLICATIONS

English translation of CN-111508961-A (Year: 2020).*

* cited by examiner

*Primary Examiner* — Xiaoming Liu
(74) *Attorney, Agent, or Firm* — Banner & Witcoff, Ltd.

(57) ABSTRACT

The present application provides a double control gate semi-floating gate transistor and a method for preparing the same. A lightly doped well region provided with a U-shaped groove is located on a substrate; one part of a floating gate oxide layer covers sidewalls and a bottom of the U-shaped groove, the other part covers the lightly doped well region on one side, and the floating gate oxide layer covering the lightly doped well region; a floating gate polysilicon layer is filled in the U-shaped groove and covers the floating gate oxide layer; a polysilicon control gate stack includes a polysilicon control gate oxide layer on the floating gate polysilicon layer and a polysilicon control gate polysilicon layer on the polysilicon control gate oxide layer; a metal control gate stack includes a high-K dielectric layer and a metal gate.

11 Claims, 4 Drawing Sheets

DOUBLE CONTROL GATE SEMI-FLOATING GATE TRANSISTOR AND METHOD FOR PREPARING THE SAME

CROSS-REFERENCES TO RELATED APPLICATIONS

This application claims priority to Chinese patent application No. 202110115619.7, filed on Jan. 28, 2021, and entitled "Double Control Gate Semi-Floating Gate Transistor and Method for Preparing the Same", the disclosure of which is incorporated herein by reference in entirety.

TECHNICAL FIELD

The present application relates to the technical field of semiconductors, in particular to a double control gate semi-floating gate transistor and a method for preparing the same.

BACKGROUND

With the decrease of the size of semiconductor devices to process nodes of 28 nm and less than 28 nm, the thickness of gate dielectric layer SiON is reduced to less than 2 nm, which leads to the increase of the leakage current of the device. The semiconductor industry uses high-K dielectric material $HfO_2$ to replace SiON as the gate oxide layer to reduce the quantum tunneling effect of the gate dielectric layer, so as to effectively improve the gate leakage current and the power consumption caused thereby.

Semi-floating gate transistor is an alternative concept of DRAM devices, which is different from the conventional 1T1C structure. A semi-floating gate device consists of a floating gate transistor, an embedded tunneling transistor and a PN junction. The floating gate of floating gate transistor is written and erased through the channel of the embedded tunneling transistor and the PN junction. In order to improve the leakage current of the gate, a high-K dielectric material is used in the control gate, which can effectively improve the leakage current of the gate during erasing and writing, but weaken the electric field control of the control gate during reading.

Therefore, it is necessary to provide a novel device structure and a method for preparing the same to solve the above problems.

BRIEF SUMMARY

In view of the shortcomings of the prior art, the purpose of the present application is to provide a double control gate semi-floating gate transistor and a method for preparing the same, which are used to solve the problems of great quantum tunneling effect of the gate dielectric layer during charging of the floating gate of the semi-floating device and weak electric field control during reading of the control gate in the prior art.

In order to realize the above purpose and other related purposes, the present application provides a double control gate semi-floating gate transistor, which at least includes:

a substrate 200 and a lightly doped well region 201 on the substrate, the lightly doped well region being provided with a U-shaped groove 203, a bottom of the U-shaped groove being located on an upper surface of the substrate;

a floating gate stack, the floating gate stack including a floating gate oxide layer 204 and a floating gate polysilicon layer 206, one part of the floating gate oxide layer 204 covering sidewalls and a bottom of the U-shaped groove 203, the other part covering an upper surface of the lightly doped well region 201 on one side of the U-shaped groove, the floating gate oxide layer 204 covering the upper surface of the lightly doped well region 201 being provided with an opening for exposing 205 the upper surface of the lightly doped well region 201, the floating gate polysilicon layer 206 being filled in the U-shaped groove and covering the floating gate oxide layer 204 and the opening 205, the floating gate polysilicon layer 206 being in contact with the upper surface of the lightly doped well region 201 by covering the opening 205;

a polysilicon control gate stack, the polysilicon control gate stack including a polysilicon control gate oxide layer 207 on the floating gate polysilicon layer 206 and a polysilicon control gate polysilicon layer 208 on the polysilicon control gate oxide layer 207;

a metal control gate stack, the metal control gate stack including a high-K dielectric layer 209 and a metal gate 210 on the high-K dielectric layer 209, the metal control gate stack continuously covering a part of the polysilicon control gate polysilicon layer 208 and the lightly doped well region 201, an upper surface of the metal gate 210 being higher than an upper surface of the polysilicon control gate polysilicon layer 208;

sidewalls 211 formed on sidewalls of the metal gate 210 and outer sides of the floating gate stack and the polysilicon control gate stack;

source and drain regions, the source and drain regions being respectively located in the lightly doped well region 201 on outer sides of the floating gate stack, the polysilicon control gate stack and the metal control gate stack.

Alternatively, a height difference between the upper surface of the metal gate 210 and the upper surface of the polysilicon control gate polysilicon layer 208 is 0.1-50 nm.

Alternatively, the width of the metal control gate stack covering the polysilicon control gate polysilicon layer 208 is 1-100 nm.

Alternatively, the width of the polysilicon control gate polysilicon layer 208 not covered by the metal control gate stack is 1-100 nm.

Alternatively, the uncovered part of the polysilicon control gate polysilicon layer 208 is used for leading out a conducting wire.

Alternatively, the width of the metal control gate stack covering the lightly doped well region 201 is 1-100 nm.

Alternatively, the doping type of the source and drain regions is light doping.

Alternatively, the doping type of the substrate is heavy doping.

Alternatively, the lightly doped well region 201, the source and drain regions and the substrate are a combination of p-type doping and n-type doping.

Alternatively, the high-K dielectric layer 209 is at least one of $ZrO_2$, ZrON, ZrON, ZrSiON, HfZrO, HfZrON, HfON, $HfO_2$, HfAlO, HfAlON, HfSiO, HfSiON, HfLaO and HfLaON.

Alternatively, the metal gate 210 is at least one of TiN, TaN, MoN, WN, TaC and TaCN.

The present application further provides a method for preparing the double control gate semi-floating gate transistor, which at least includes:

step 1: providing a substrate 200, forming a lightly doped well region 201 on the substrate, and etching the lightly doped well region 201 to form a U-shaped groove 203, a bottom of the U-shaped groove being located on an upper surface of the substrate;

step 2: forming a floating gate oxide layer 204 on an upper surface of the lightly doped well region and a surface of the U-shaped groove, and etching the floating gate oxide layer 204 to form an opening 205 for exposing the upper surface of the lightly doped well region 201 in the substrate;

step 3: depositing a floating gate polysilicon layer 206 to fill the U-shaped groove 203 and cover the floating gate oxide layer 204 and the opening 205, the floating gate oxide layer 204 and the floating gate polysilicon layer 206 forming a floating gate stack;

step 4: sequentially forming a polysilicon control gate oxide layer 207 on the floating gate polysilicon layer 206, and forming a polysilicon control gate polysilicon layer 208 on the polysilicon control gate oxide layer 207, the polysilicon control gate oxide layer 207 and the polysilicon control gate polysilicon layer 208 forming a polysilicon control gate stack;

step 5: etching the polysilicon control gate polysilicon layer 208, the polysilicon control gate oxide layer 207, the floating gate polysilicon layer 206 and the floating gate oxide layer 204 to expose the upper surface of the lightly doped well region 201 on the side of the opening;

step 6: forming a high-K dielectric layer 209 continuously covering a part of the polysilicon control gate polysilicon layer 208 and the lightly doped well region 201 and a metal gate 210 on the high-K dielectric layer 209, an upper surface of the formed metal gate 210 being higher than an upper surface of the polysilicon control gate polysilicon layer 208;

step 7: etching the floating gate stack and the polysilicon control gate stack to define source and drain regions;

step 8: forming sidewalls 211 on sidewalls of the metal gate 210 and outer sides of the floating gate stack and the polysilicon control gate stack;

step 9: performing ion implantation in the lightly doped well region 201 on the outer sides of the floating gate stack, the polysilicon control gate stack and the metal control gate stack to form source and drain regions.

As described above, the double control gate semi-floating gate transistor and the method for preparing the same provided by the present application have the following beneficial effects: the high-K dielectric material and the metal gate in the present application can reduce the quantum tunneling effect of the gate dielectric layer during charging of the floating gate, and improve the gate leakage and the power consumption caused thereby. The polysilicon gate can obtain better electric field control during reading and writing of the device; the polysilicon control gate and the metal control gate can work independently, such that the device achieves the function of reading and writing at the same time.

DETAILED DESCRIPTION

Figure 1:
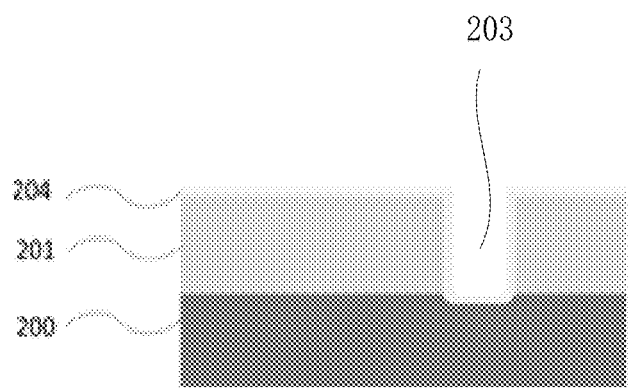
FIG. 1 illustrates a structural schematic view after a U-shaped groove is formed in a lightly doped well region on a substrate in the present application.

The embodiments of the present application will be described below through specific examples, and those skilled in the art can easily understand other advantages and effects of the present application from the content disclosed in the description. The present application may also be implemented or applied through other different specific embodiments, and the details in the description may also be modified or changed based on different views and applications without departing from the spirit of the present application.

Please refer to FIG. 1-FIG. 11. It should be noted that the drawings provided in the embodiment only are only used for schematically describing the basic concept of the present application, so the components related to the present application are only illustrated in the drawings, rather than are drawn according to the number, shape and size of the components in actual implementation. The pattern, number and scale of each component in actual implementation may be freely changed, and the component layout pattern may be more complex.

Figure 11:
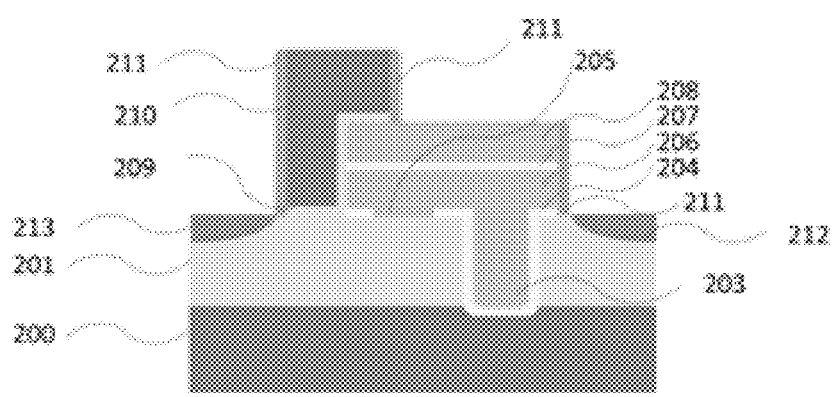
FIG. 11 illustrates a structural schematic view of a double control gate semi-floating gate transistor provided by the present application.

The present application provides a double control gate semi-floating gate transistor. Referring to FIG. 11, it illustrates a structural schematic view of a double control gate semi-floating gate transistor provided by the present application. The double control gate semi-floating gate transistor at least includes a substrate 200 and a lightly doped well region 201 on the substrate; the lightly doped well region is provided with a U-shaped groove 203; a bottom of the U-shaped groove 203 is located on an upper surface of the substrate 200; the lightly doped well region in this embodiment is a combination of p-type doping and n-type doping.

The double control gate semi-floating gate transistor further includes a floating gate stack; the floating gate stack includes a floating gate oxide layer 204 and a floating gate polysilicon layer 206; referring to FIG. 11, one part of the floating gate oxide layer 204 covers sidewalls and a bottom of the U-shaped groove 203, the other part covers an upper surface of the lightly doped well region 201 on one side of the U-shaped groove, and the floating gate oxide layer 204 covering the upper surface of the lightly doped well region 201 is provided with an opening 205 for exposing the upper surface of the lightly doped well region 201; in other words, the floating gate oxide layer 204 is located on the sidewalls and bottom of the U-shaped groove 203, the floating gate oxide layer 204 covers the upper surface of the lightly doped well region 201, the covered part of the lightly doped well region 201 is provided with the opening 205, and exposing the upper surface of the lightly doped well region 201 means that the opening 205 is not covered by the floating gate oxide layer 204.

The floating gate polysilicon layer 206 is filled in the U-shaped groove and covers the floating gate oxide layer 204 and the opening 205, and the floating gate polysilicon layer 206 is in contact with the upper surface of the lightly doped well region 201 by covering the opening 205. Referring to FIG. 11, in other words, the U-shaped groove is filled with the floating gate polysilicon layer 206, and the floating gate polysilicon layer 206 covers the floating gate oxide layer 204 and the opening 205. Since the opening 205 exposes the upper surface of the lightly doped well region 201, the floating gate polysilicon layer 206 is in contact with the upper surface of the lightly doped well region 201 by covering the opening 205.

The double control gate semi-floating gate transistor further includes a polysilicon control gate stack; referring to FIG. 11, the polysilicon control gate stack includes a polysilicon control gate oxide layer 207 on the floating gate polysilicon layer 206 and a polysilicon control gate polysilicon layer 208 on the polysilicon control gate oxide layer 207.

The double control gate semi-floating gate transistor further includes a metal control gate stack; the metal control gate stack includes a high-K dielectric layer 209 and a metal gate 210 on the high-K dielectric layer 209; the metal control gate stack continuously covers a part of the polysilicon control gate polysilicon layer 208 and the lightly doped well region 201; an upper surface of the metal gate 210 is higher than an upper surface of the polysilicon control gate polysilicon layer 208. Referring to FIG. 11, in other words, a part of the high-K dielectric layer 209 and the metal gate 210 in the metal control gate stack covers the lightly doped well region 201, extends from the part covering the lightly doped well region 201 to the top of the polysilicon control gate polysilicon layer 208 along the floating gate oxide layer 204 and the polysilicon control gate oxide layer 207, and stops at the top of the polysilicon control gate polysilicon layer 208, and a part of the top of the polysilicon control gate polysilicon layer 208 is covered by the metal control gate stack.

Further, the high-K dielectric layer 209 is at least one of $ZrO_2$, ZrON, ZrON, ZrSiON, HfZrO, HfZrON, HfON, $HfO_2$, HfAlO, HfAlON, HfSiO, HfSiON, HfLaO and HfLaON. The metal gate 210 is at least one of TiN, TaN, MoN, WN, TaC and TaCN.

Further, in the present application, a height difference between the upper surface of the metal gate 210 and the upper surface of the polysilicon control gate polysilicon layer 208 is 0.1-50 nm. Further, in the present application, the width of the metal control gate stack covering the polysilicon control gate polysilicon layer 208 is 1-100 nm in this embodiment. Further, the width of the polysilicon control gate polysilicon layer 208 not covered by the metal control gate stack is 1-100 nm. The uncovered part of the polysilicon control gate polysilicon layer 208 is used for leading out a conducting wire.

The width of the metal control gate stack covering the lightly doped well region 201 is 1-100 nm.

The double control gate semi-floating gate transistor further includes sidewalls 211 formed on sidewalls of the metal gate 210 and outer sides of the floating gate stack and the polysilicon control gate stack.

The double control gate semi-floating gate transistor further includes source and drain regions; the source and drain regions are respectively located in the lightly doped well region 201 on outer sides of the floating gate stack, the polysilicon control gate stack and the metal control gate stack. Referring to FIG. 11, In other words, the source region 213 and the drain region 212 are respectively located in the lightly doped well region 201 on the outer sides of the floating gate stack, the polysilicon control gate stack and the metal control gate stack. Further, in the present application, the doping type of the source and drain regions is light doping in this embodiment. Further, the doping type of the substrate is heavy doping.

The lightly doped well region 201, the source and drain regions and the substrate are a combination of p-type doping and n-type doping.

The present application further provides a method for preparing the double control gate semi-floating gate transistor, which at least includes the following steps:

In step 1, a substrate 200 is provided, a lightly doped well region 201 is formed on the substrate, the lightly doped well region 201 is etched to form a U-shaped groove 203, and a bottom of the U-shaped groove is located on an upper surface of the substrate. Referring to FIG. 1, it illustrates a structural schematic view after the U-shaped groove is formed in the lightly doped well region on the substrate in the present application. In step 1, a lightly doped well region 201 is formed on the substrate 200, then the lightly doped well region 201 is etched to the substrate to form a U-shaped groove 203 in the lightly doped well region 201, and a bottom of the U-shaped groove 203 is located on the substrate.

Figure 2:
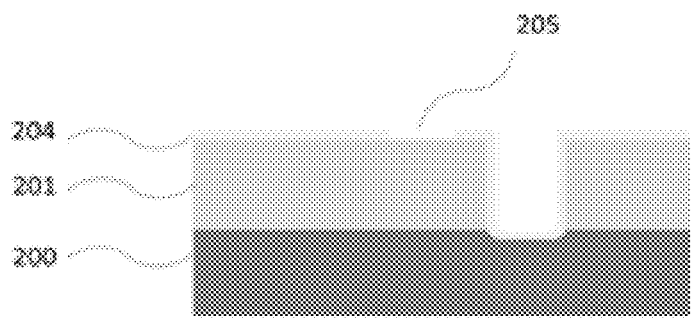
FIG. 2 illustrates a structural schematic view after a floating gate oxide layer is formed on surfaces of a lightly doped well region and a U-shaped groove in the present application.

In step 2, a floating gate oxide layer 204 is formed on an upper surface of the lightly doped well region and a surface of the U-shaped groove, and the floating gate oxide layer 204 is etched to form an opening 205 for exposing the upper surface of the lightly doped well region 201 in the substrate. Referring to FIG. 2, it illustrates a structural schematic view after the floating gate oxide layer is formed on surfaces of the lightly doped well region and the U-shaped groove in the present application. After the floating gate oxide layer 204 is formed, the floating gate oxide layer 204 on the upper surface of the lightly doped well region 201 is etched to form an opening 205 for exposing the lightly doped well region 201.

Figure 3:
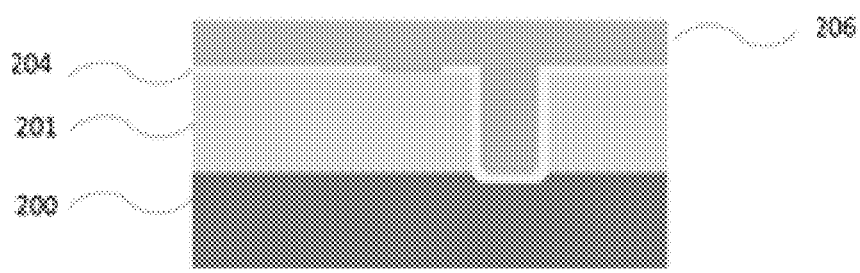
FIG. 3 illustrates a structural schematic view after a floating gate polysilicon layer is formed on a floating gate oxide layer and a U-shaped groove in the present application.

In step 3, a floating gate polysilicon layer 206 is deposited to fill the U-shaped groove 203 and cover the floating gate oxide layer 204 and the opening 205; the floating gate oxide layer 204 and the floating gate polysilicon layer 206 form a floating gate stack. Referring to FIG. 3, it illustrates a structural schematic view after the floating gate polysilicon layer is formed on the floating gate oxide layer and the U-shaped groove in the present application. In other words, the U-shaped groove 203 is filled with the floating gate polysilicon layer 206, and then the floating gate polysilicon layer 206 is formed on the floating gate oxide layer 204 and the opening 205.

Figure 4:
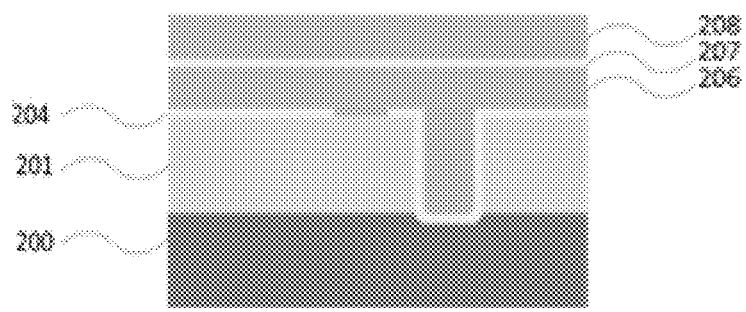
FIG. 4 illustrates a structural schematic view after a polysilicon control gate oxide layer and a polysilicon control gate polysilicon layer are formed in the present application.

In step 4, sequentially a polysilicon control gate oxide layer 207 is formed on the floating gate polysilicon layer 206, and a polysilicon control gate polysilicon layer 208 is formed on the polysilicon control gate oxide layer 207; the polysilicon control gate oxide layer 207 and the polysilicon control gate polysilicon layer 208 form a polysilicon control gate stack. Referring to FIG. 4, it illustrates a structural schematic view after the polysilicon control gate oxide layer and the polysilicon control gate polysilicon layer are formed in the present application.

Figure 5:
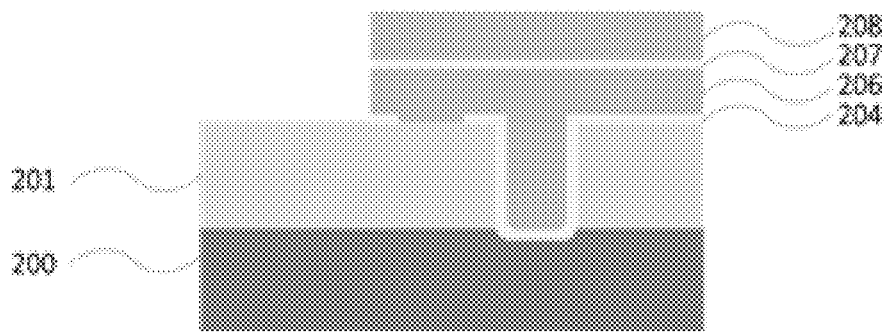
FIG. 5 illustrates a structural schematic view after a floating gate stack and a polysilicon control gate stack are etched to expose an upper surface of a lightly doped well region in the present application.

In step 5, the polysilicon control gate polysilicon layer 208, the polysilicon control gate oxide layer 207, the floating gate polysilicon layer 206 and the floating gate oxide layer 204 are etched to expose the upper surface of the lightly doped well region 201 on the side of the opening. Referring to FIG. 5, it illustrates a structural schematic view after the floating gate stack and the polysilicon control gate stack are etched to expose the upper surface of the lightly doped well region in the present application.

Figure 6:
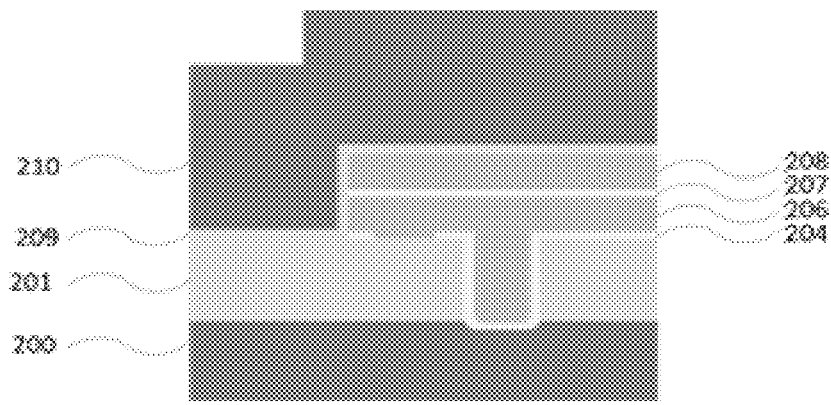
FIG. 6 illustrates a structural schematic view when a metal control gate stack is formed in the present application.
Figure 7:
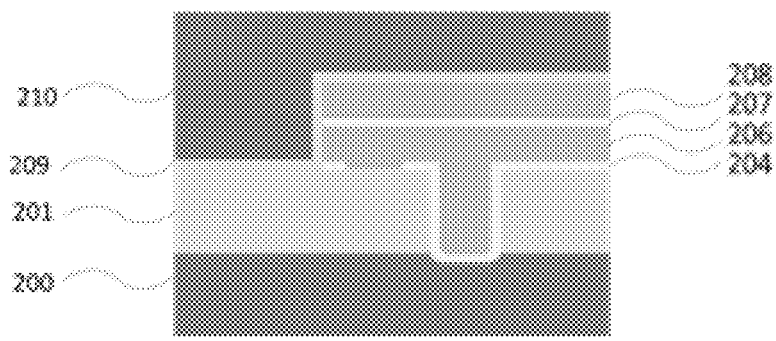
FIG. 7 illustrates a structural schematic view after a metal gate is flattened in the present application.
Figure 8:
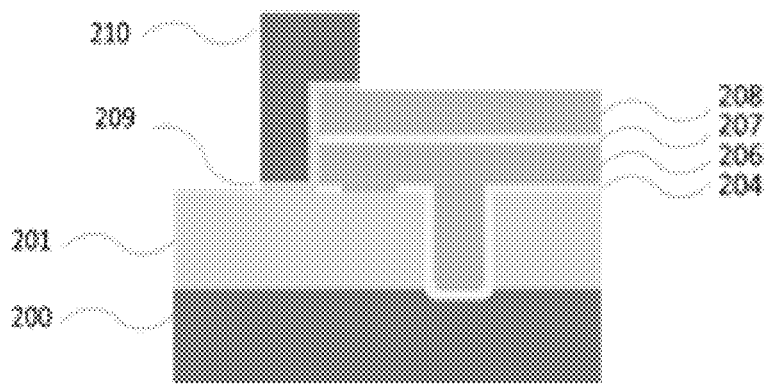
FIG. 8 illustrates a structural schematic view after a floating gate stack and a polysilicon control gate stack are etched in the present application.
Figure 9:
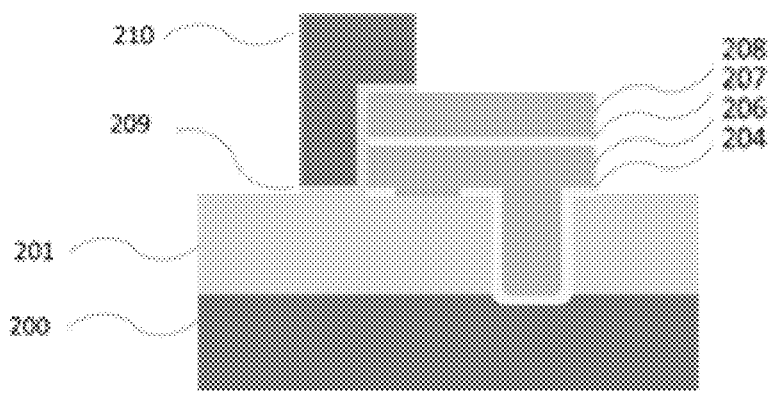
FIG. 9 illustrates a structural schematic view after a high-K dielectric layer and a metal gate are etched in the present application.

In step 6, a high-K dielectric layer 209 continuously covering a part of the polysilicon control gate polysilicon layer 208 and the lightly doped well region 201 and a metal gate 210 on the high-K dielectric layer 209 are formed; an upper surface of the formed metal gate 210 is higher than an upper surface of the polysilicon control gate polysilicon layer 208. Referring to FIG. 6, it illustrates a structural schematic view when the metal control gate stack is formed in the present application. In other words, a part of the high-K dielectric layer 209 and the metal gate 210 covers the lightly doped well region 201, extends from the part covering the lightly doped well region 201 to the top of the polysilicon control gate polysilicon layer 208 along the floating gate oxide layer 204 and the polysilicon control gate oxide layer 207, and stops at the top of the polysilicon control gate polysilicon layer 208, and a part of the top of the polysilicon control gate polysilicon layer 208 is covered by the metal control gate stack.

In step 7, the floating gate stack and the polysilicon control gate stack, the high-K dielectric layer 209 and the metal gate 210 are etched to define source and drain regions. Before step 7 is performed, the metal gate 210 needs to be firstly flattened to form a structure illustrated in FIG. 7, which illustrates a structural schematic view after the metal gate is flattened in the present application. Next, step 7 is performed, the floating gate stack and the polysilicon control gate stack are etched to form a structure illustrated in FIG. 8, which illustrates a structural schematic view after the floating gate stack and the polysilicon control gate stack are etched in the present application. In step 7, the high-K dielectric layer 209 and the metal gate 210 are also etched to form a structure illustrated in FIG. 9, which illustrates a structural schematic view after the high-K dielectric layer and the metal gate are etched in the present application.

Figure 10:
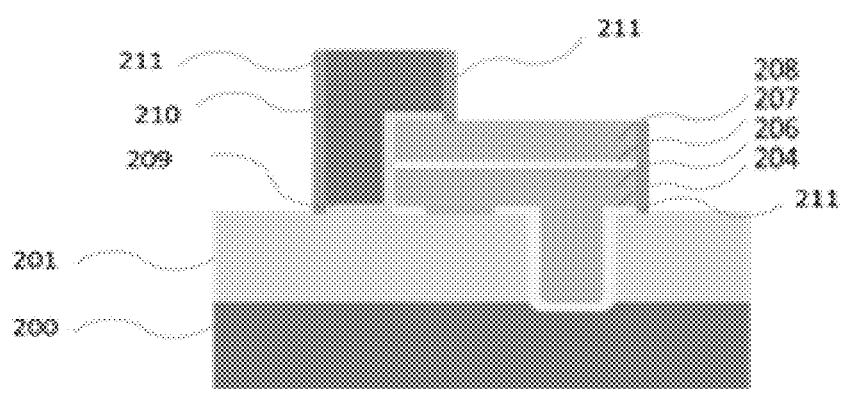
FIG. 10 illustrates a structural schematic view after sidewalls are formed on sidewalls of a metal gate and outer sides of a floating gate stack and a polysilicon control gate stack in the present application.

In step 8, sidewalls 211 are formed on sidewalls of the metal gate 210 and outer sides of the floating gate stack and the polysilicon control gate stack. Referring to FIG. 10, it illustrates a structural schematic view after the sidewalls are formed on the sidewalls of the metal gate and the outer sides of the floating gate stack and the polysilicon control gate stack in the present application.

In step 9, ion implantation is performed in the lightly doped well region 201 on the outer sides of the floating gate stack, the polysilicon control gate stack and the metal control gate stack to form source and drain regions. Referring to FIG. 11, it illustrates a structural schematic view after the source and drain regions are formed the present application. The source region 213 and the drain region 201 are respectively formed in the lightly doped well region 201.

To sum up, the high-K dielectric material and the metal gate in the present application can reduce the quantum tunneling effect of the gate dielectric layer during charging of the floating gate, and improve the gate leakage and the power consumption caused thereby. The polysilicon gate can obtain better electric field control during reading and writing of the device; the polysilicon control gate and the metal control gate can work independently, such that the device achieves the function of reading and writing at the same time. Therefore, the present application effectively overcomes various disadvantages in the prior art, and thus has a great industrial utilization value.

The embodiments are only used for describing the principle and effect of the present application, instead of limiting the present application. Those skilled in the art may modify or change the embodiments without departing from the spirit and scope of the present application. Therefore, all equivalent modifications or changes made by those with common knowledge in the art without departing from the spirit and technical idea disclosed in the present application shall still be covered by the claims of the present application.

What is claimed is:

1. A double control gate semi-floating gate transistor, wherein the double control gate semi-floating gate transistor at least comprises:
    a substrate 200 and a lightly doped well region 201 on the substrate, the lightly doped well region being provided with a U-shaped groove 203, a bottom of the U-shaped groove being located on an upper surface of the substrate;
    a floating gate stack, the floating gate stack comprising a floating gate oxide layer 204 and a floating gate polysilicon layer 206, one part of the floating gate oxide layer 204 covering sidewalls and the bottom of the U-shaped groove 203, the other part covering an upper surface of the lightly doped well region 201 on one side of the U-shaped groove, the floating gate oxide layer 204 covering the upper surface of the lightly doped well region 201 being provided with an opening 205 for exposing the upper surface of the lightly doped well region 201, the floating gate polysilicon layer 206 being filled in the U-shaped groove and covering the floating gate oxide layer 204 and the opening 205, the floating gate polysilicon layer 206 being in contact with the upper surface of the lightly doped well region 201 by covering the opening 205;
    a polysilicon control gate stack, the polysilicon control gate stack comprising a polysilicon control gate oxide layer 207 on the floating gate polysilicon layer 206 and a polysilicon control gate polysilicon layer 208 on the polysilicon control gate oxide layer 207;
    a metal control gate stack, the metal control gate stack comprising a high-K dielectric layer 209 and a metal gate 210 on the high-K dielectric layer 209, the metal control gate stack continuously covering a part of the polysilicon control gate polysilicon layer 208 and the lightly doped well region 201, an upper surface of the metal gate 210 being higher than an upper surface of the polysilicon control gate polysilicon layer 208, wherein a height difference between the upper surface of the metal gate 210 and the upper surface of the polysilicon control gate polysilicon layer 208 is 0.1-50 nm;
    sidewalls 211 formed on sidewalls of the metal gate 210 and outer sides of the floating gate stack and the polysilicon control gate stack; and
    source and drain regions, the source and drain regions being respectively located in the lightly doped well region 201 on outer sides of the floating gate stack, the polysilicon control gate stack and the metal control gate stack.

2. The double control gate semi-floating gate transistor according to claim 1, wherein a width of the metal control gate stack covering the polysilicon control gate polysilicon layer 208 is 1-100 nm.

3. The double control gate semi-floating gate transistor according to claim 2, wherein a width of the polysilicon control gate polysilicon layer 208 not covered by the metal control gate stack is 1-100 nm.

4. The double control gate semi-floating gate transistor according to claim 3, wherein an uncovered part of the polysilicon control gate polysilicon layer 208 is used for leading out a conducting wire.

5. The double control gate semi-floating gate transistor according to claim 1, wherein a width of the metal control gate stack covering the lightly doped well region 201 is 1-100 nm.

6. The double control gate semi-floating gate transistor according to claim 1, wherein a doping type of the source and drain regions is light doping.

7. The double control gate semi-floating gate transistor according to claim 6, wherein a doping type of the substrate is heavy doping.

8. The double control gate semi-floating gate transistor according to claim 7, wherein the lightly doped well region 201, the source and drain regions, and the substrate are a combination of p-type doping and n-type doping.

9. The double control gate semi-floating gate transistor according to claim 1, wherein the high-K dielectric layer 209 is at least one of $ZrO_2$, ZrON, ZrSiON, HfZrO, HfZrON, HfON, $HfO_2$, HfAlO, HfAlON, HfSiO, HfSiON, HfLaO, and HfLaON.

10. The double control gate semi-floating gate transistor according to claim 1, wherein the metal gate 210 is at least one of TiN, TaN, MoN, WN, TaC, and TaCN.

11. A method for preparing the double control gate semi-floating gate transistor according to claim 1, wherein the method at least comprises:

step 1: providing the substrate 200, forming the lightly doped well region 201 on the substrate, and etching the lightly doped well region 201 to form the U-shaped groove 203, the bottom of the U-shaped groove being located on the upper surface of the substrate;

step 2: forming the floating gate oxide layer 204 on the upper surface of the lightly doped well region and a surface of the U-shaped groove, and etching the floating gate oxide layer 204 to form the opening 205 for exposing the upper surface of the lightly doped well region 201 in the substrate;

step 3: depositing the floating gate polysilicon layer 206 to fill the U-shaped groove 203 and cover the floating gate oxide layer 204 and the opening 205, the floating gate oxide layer 204 and the floating gate polysilicon layer 206 forming the floating gate stack;

step 4: sequentially forming the polysilicon control gate oxide layer 207 on the floating gate polysilicon layer 206, and forming the polysilicon control gate polysilicon layer 208 on the polysilicon control gate oxide layer 207, the polysilicon control gate oxide layer 207 and the polysilicon control gate polysilicon layer 208 forming the polysilicon control gate stack;

step 5: etching the polysilicon control gate polysilicon layer 208, the polysilicon control gate oxide layer 207, the floating gate polysilicon layer 206, and the floating gate oxide layer 204 to expose the upper surface of the lightly doped well region 201 on a side of the opening;

step 6: forming the high-K dielectric layer 209 continuously covering the part of the polysilicon control gate polysilicon layer 208 and the lightly doped well region 201 and the metal gate 210 on the high-K dielectric layer 209, the upper surface of the formed metal gate 210 being higher than the upper surface of the polysilicon control gate polysilicon layer 208;

step 7: etching the floating gate stack and the polysilicon control gate stack to define the source and drain regions;

step 8: forming the sidewalls 211 on the sidewalls of the metal gate 210 and the outer sides of the floating gate stack and the polysilicon control gate stack; and step 9: performing ion implantation in the lightly doped well region 201 on the outer sides of the floating gate stack, the polysilicon control gate stack, and the metal control gate stack to form the source and drain regions.

* * * * *